United States Patent
Zimmermann

(10) Patent No.: US 8,405,381 B2
(45) Date of Patent: Mar. 26, 2013

(54) POWER SENSOR FOR A CURRENT CARRYING CONDUCTOR

(75) Inventor: Rudolf Zimmermann, Sulzbach-Rosenberg (DE)

(73) Assignee: Siemens Aktiengesellschaft, Munich (DE)

( * ) Notice: Subject to any disclaimer, the term of this patent is extended or adjusted under 35 U.S.C. 154(b) by 166 days.

(21) Appl. No.: 12/675,178

(22) PCT Filed: Aug. 27, 2007

(86) PCT No.: PCT/EP2007/007493
§ 371 (c)(1),
(2), (4) Date: Feb. 25, 2010

(87) PCT Pub. No.: WO2009/026945
PCT Pub. Date: Mar. 5, 2009

(65) Prior Publication Data
US 2010/0308797 A1   Dec. 9, 2010

(51) Int. Cl.
*G01R 15/18* (2006.01)
(52) U.S. Cl. .............. 324/127; 324/117 H; 324/117 R
(58) Field of Classification Search .............. 324/127
See application file for complete search history.

(56) References Cited

U.S. PATENT DOCUMENTS

| | | | | |
|---|---|---|---|---|
| 3,626,291 A | * | 12/1971 | Yauch et al. | 324/127 |
| 3,629,693 A | * | 12/1971 | Anderson | 323/358 |
| 3,771,049 A | * | 11/1973 | Piccione | 340/664 |
| 4,100,488 A | * | 7/1978 | Quietzsch et al. | 324/127 |
| 4,283,677 A | * | 8/1981 | Niwa | 324/127 |
| 4,709,339 A | * | 11/1987 | Fernandes | 700/293 |
| 4,847,780 A | | 7/1989 | Berezinski | |
| 5,006,846 A | * | 4/1991 | Granville et al. | 340/870.28 |
| 5,012,218 A | * | 4/1991 | Haug et al. | 336/174 |
| 5,355,109 A | * | 10/1994 | Yamazaki | 336/92 |
| 5,426,360 A | * | 6/1995 | Maraio et al. | 324/126 |
| 5,793,214 A | * | 8/1998 | Wakamatsu | 324/601 |
| 5,825,175 A | * | 10/1998 | Selcuk | 324/117 H |
| 6,018,239 A | * | 1/2000 | Berkcan et al. | 324/127 |
| 6,040,778 A | * | 3/2000 | Hopkins et al. | 340/650 |
| 6,154,028 A | * | 11/2000 | Bushida et al. | 324/253 |
| 6,624,624 B1 | * | 9/2003 | Karrer et al. | 324/117 R |
| 6,680,608 B2 | * | 1/2004 | Kojovic | 324/127 |
| 6,717,397 B2 | * | 4/2004 | Sorenson, Jr. | 324/126 |
| 7,215,058 B2 | | 5/2007 | Von Knorre | |
| 7,859,378 B2 | * | 12/2010 | Merck et al. | 336/90 |
| 8,159,211 B2 | * | 4/2012 | Wang et al. | 324/127 |
| 2006/0284647 A1 | * | 12/2006 | Gunn et al. | 324/771 |

FOREIGN PATENT DOCUMENTS

| | | |
|---|---|---|
| DE | 10148525 A1 | 4/2003 |
| GB | 522276 A | 6/1940 |

* cited by examiner

*Primary Examiner* — Richard Isla Rodas
(74) *Attorney, Agent, or Firm* — Harness, Dickey & Pierce P.L.C.

(57) ABSTRACT

A power sensor is disclosed for a current carrying conductor. In at least one embodiment, the sensor includes at least one ferromagnetic core, a secondary winding, and at least one of connecting elements for a load or a load. The secondary winding is designed as an injection molded part on an insulating layer that is injection molded onto the ferromagnetic core.

17 Claims, 2 Drawing Sheets

POWER SENSOR FOR A CURRENT CARRYING CONDUCTOR

PRIORITY STATEMENT

This application is the national phase under 35 U.S.C. §371 of PCT International Application No. PCT/EP2007/007493 which has an International filing date of Aug. 27, 2007, which designates the United States of America, the entire contents of each of which are hereby incorporated herein by reference.

FIELD

At least one embodiment of the present application is generally directed to a power sensor.

BACKGROUND

For the monitoring of currents and voltages in power technology, due to their high values these must generally be converted into proportional comparison values by means of an intermediary unit, in order to be able to record and analyze them with conventional measuring devices.

In switchgear and switching device technology so-called current converters are known, which in the "plug-in current transformer" format surround a current-carrying conductor in an annular manner and are thus also designated as donut-type current transformers. In accordance with their electromagnetic functional principle, these converters are also designated as a special type of transformer.

Around a core of ferromagnetic material, which surrounds a primary winding comprising the conductor with the current to be determined, runs a secondary winding, to the ends of which is connected a resistance—the so-called load—at which in turn a voltage value proportional to the primary current can be measured.

This value is, for example, processed in electrically monitored circuit-breakers in relation to overload protection for the connected consumers.

SUMMARY

The known donut-type current transformers are however relatively expensive to produce and assemble. Thus, at least one embodiment of the present application is directed to a power sensor which is simpler or as the case may be cheaper to manufacture.

BRIEF DESCRIPTION OF THE DRAWINGS

Embodiments of the invention are explained in the following with reference to the examples represented in the attached drawings, in which.

DETAILED DESCRIPTION OF THE EXAMPLE EMBODIMENTS

Figure 1:
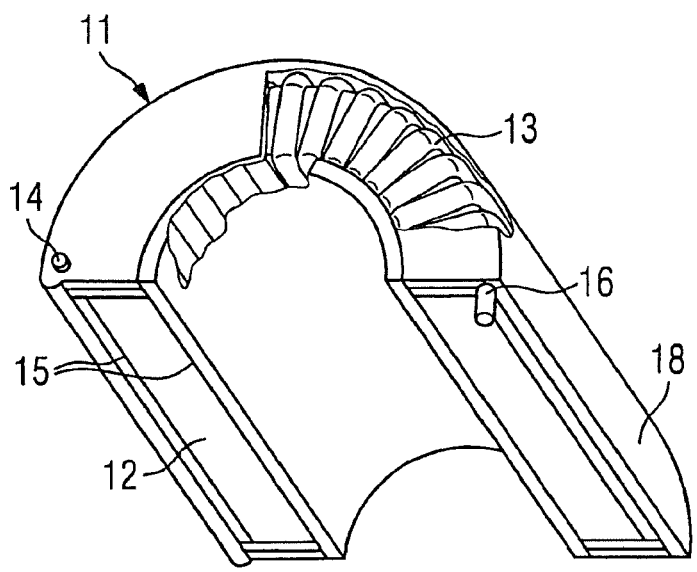
FIG. 1 shows the structure of a half-shell.

FIG. 1 shows the structure of a half-shell 11. The annular or pipe-like half-shell is manufactured using multi-component injection molding methods and contains the ferromagnetic core 12, the secondary winding 13 and one or two connecting elements 14 for a load.

The ferromagnetic core 12 is laid in the injection molding tool as a molded part or is made of thermoplastic material filled with magnetic powder, and is likewise suitable for injection molding.

After in the course of the subsequent injection molding procedure the core half-shell 11 has been enveloped with an insulating layer 15, which has a suitable external contour according to the desired winding, the secondary winding 13 from electrically conductive plastic can now be applied, whereby in this step corresponding connecting elements 14 and connecting elements 16 for the half-shells 11, 21 can if appropriate be integrated as metal parts. Finally an outer sleeve 18 is applied in a further injection molding procedure.

Figure 2:
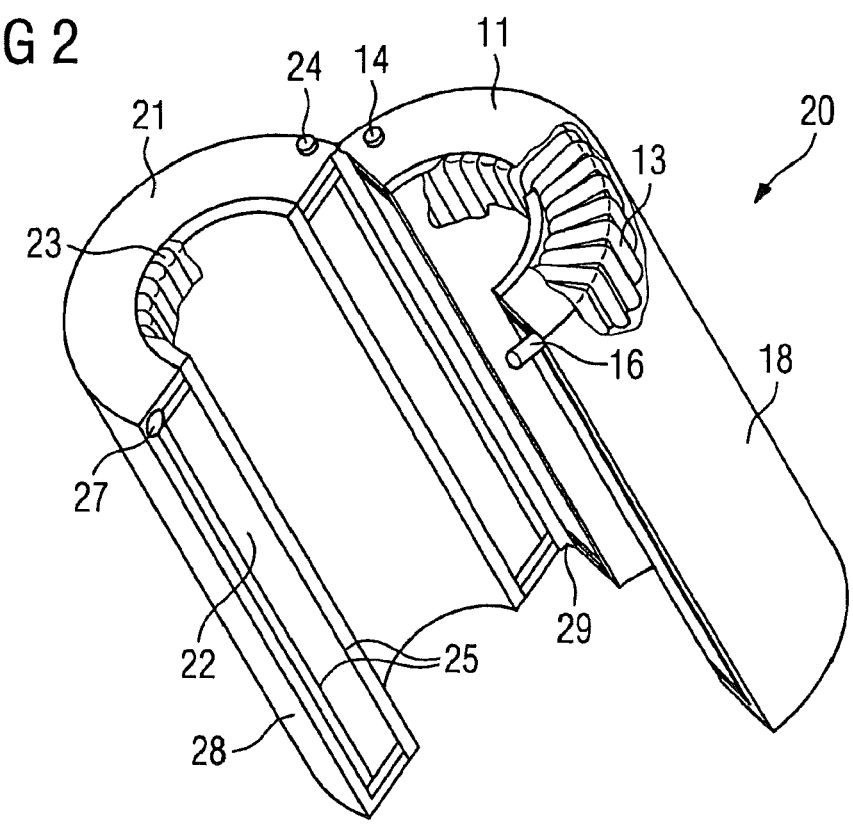
FIG. 2 shows the structure of a power sensor made up of two half-shells.

FIG. 2 shows the construction of a power sensor 20 from two half-shells 11 and 21. The parts identified with reference numbers 11, 12, 13, 14, 15 and 18 correspond to the parts with reference numbers 21, 22, 23, 24, 25 and 28. The half-shell 21 can be identical to the half-shell 11, or the studs 16 can be replaced by a notch 27.

As is evident from FIG. 2, the half-shells 11 and 21 can also be connected with an elastic hinge 29, in particular a foil hinge, and can thus be manufactured in one piece. The winding 13 or 23 respectively can if appropriate run across the hinge 29.

In one embodiment of the invention, the load is embodied as a conductive plastic string in one piece with the winding 13, 23. As a result of the characteristic of conductive plastics, of increasing their volume in the case of a flowing current, further options such as for example the direct actuation of a mechanical device are opened up. This can be a trigger for cutoff purposes or other mechanical actuator.

Figure 3:
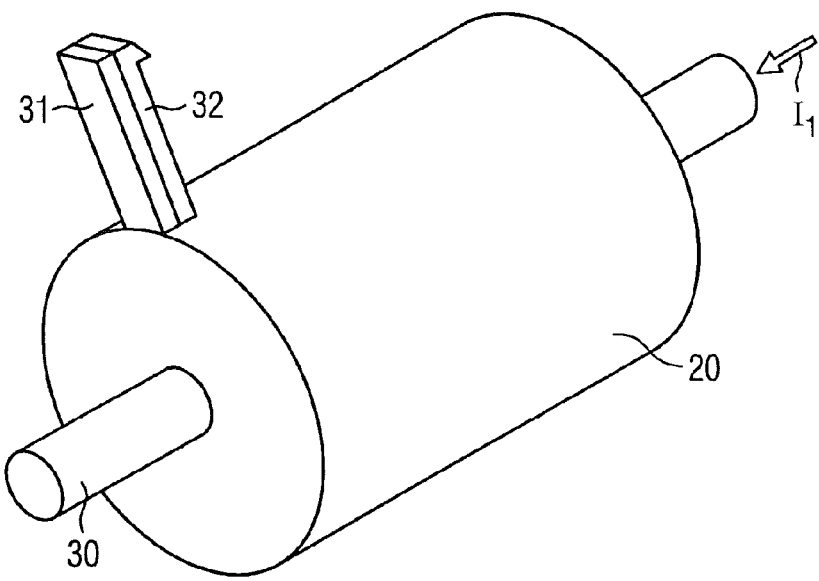
FIG. 3 shows the power sensor around a current-carrying conductor with a small current.
Figure 4:
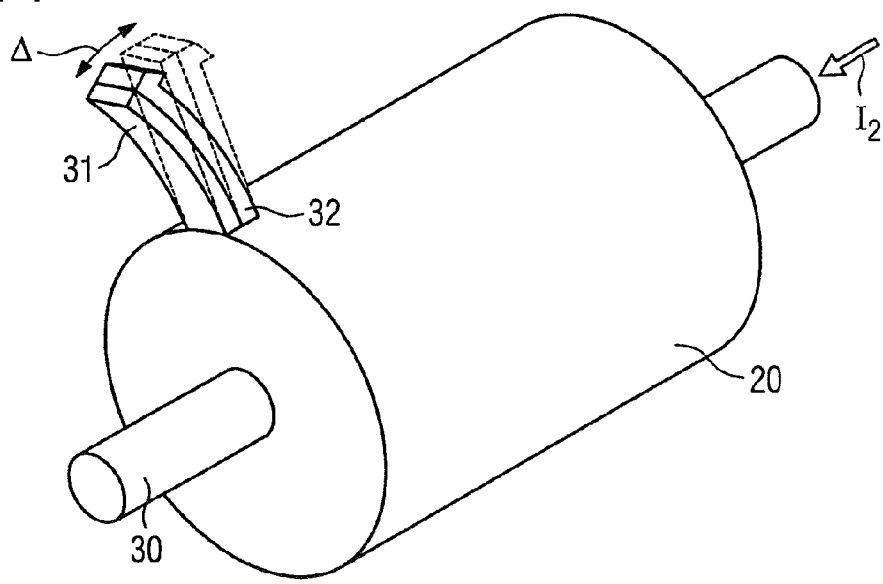
FIG. 4 shows the power sensor around a current-carrying conductor with a large current.

For the realization of mechanical movements, part of the transformer is expediently embodied as shown in FIGS. 3 and 4 in the manner of a "bi-metal" 31, 32, in order to enable the execution of a relatively large mechanical movement with a minor change in volume of the area 32 containing the load, which is in turn suitable for the release of a pre-tensioned mechanism according to the "mousetrap principle", for example for an overload cutoff. FIG. 3 represents the circumstances in the case of rated voltage ($I^1$), FIG. 4 in the case of overcurrent (I2, where I2>I1). In FIG. 4 the position of the area 32 containing the load in the case of rated voltage ($I^1$) is indicated by a broken line. The movement of the area 32 containing the load is indicated by Δ.

Figure 5:
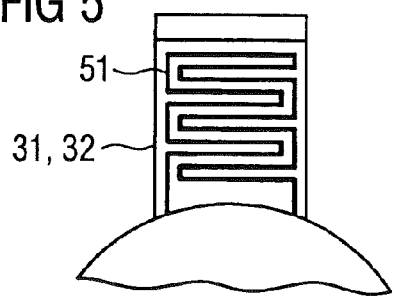
FIG. 5 shows the possible structure of the load.

It is here advantageous to embody the load 51 in a meander-like form as shown in FIG. 5, in order both to realize an appropriate resistance value and to convert the increase in volume of the conductive plastic in the deflection path in a particularly effective manner.

With the inventive combination of multi-component injection molding technology as described and the use of conductive plastics, a multiplicity of advantages of a technical and economic nature arise.

The use of injection molding to form the unit opens up possibilities for cost-effective, readily-automated production especially through the incorporation of mechanical components into an integrated design of the complete product.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A power sensor for a current-carrying conductor, comprising:
   at least two ferromagnetic cores;
   a secondary winding including a first and second portion, each portion embodied as an injection molded part on an insulating layer injection molded onto a respective one of the at least two ferromagnetic cores;
   two half-shells, each including at least one of the at least two ferromagnetic cores and either the first or the second portion of the secondary winding, the portions of the secondary winding of the two half-shells being physically connected via a connecting part embodied as an injection molded part.

2. The power sensor as claimed in claim 1, further comprising an insulating layer embodied as an injection molded part as a cover for the secondary winding.

3. The power sensor as claimed in claim 2, wherein the two half-shells are electrically connected to each other via a connecting part embodied as an injection molded part.

4. The power sensor as claimed in claim 3, wherein the connecting part is embodied as a film hinge.

5. The power sensor as claimed in claim 1, wherein the two half-shells are electrically connected to each other via a connecting part embodied as an injection molded part.

6. The power sensor as claimed in claim 5, wherein the connecting part is embodied as a film hinge.

7. The power sensor as claimed in claim 1, wherein the connecting part is embodied as a film hinge.

8. The power sensor as claimed in claim 1, wherein the at least two ferromagnetic cores are embodied as a molded part.

9. The power sensor as claimed in claim 1, wherein the at least two ferromagnetic cores are embodied as an injection molded part.

10. The power sensor as claimed in claim 9, wherein the at least two ferromagnetic cores are embodied as an injection molded part in thermoplastic material filled with magnetic powder.

11. The power sensor as claimed in claim 1, further comprising:
    at least one of integrated connecting elements and connecting elements for the half-shells.

12. The power sensor as claimed in claim 1, wherein the load is embodied as a conductive plastic string.

13. The power sensor as claimed in claim 1, further comprising at least one of a load and connecting elements for the load.

14. The power sensor as claimed in claim 1, wherein the connecting part includes a segment of the secondary winding.

15. A power sensor for a current-carrying conductor, comprising:
    at least one ferromagnetic core;
    a secondary winding embodied as an injection molded part on an insulating layer injection molded onto the at least one ferromagnetic core; and
    at least one of a load and connecting elements for the load,
    wherein the load is embodied as a conductive plastic string, at least one area which contains or surrounds the load, wherein the power sensor is embodied to move the at least one area by way of a current-dependent change in volume of an electrically conductive part of the sensor.

16. The power sensor as claimed in claim 15, where the movement is embodied to release a pre-tensioned mechanism.

17. The power sensor as claimed in claim 15, wherein the power sensor further comprises two half-shells, each including at least one ferromagnetic core.

* * * * *